(12) United States Patent
Wu et al.

(10) Patent No.: US 9,627,058 B2
(45) Date of Patent: Apr. 18, 2017

(54) RESISTANCE RANDOM ACCESS MEMORY WITH ACCURATE FORMING PROCEDURE, OPERATING METHOD THEREOF AND OPERATING SYSTEM THEREOF

(71) Applicant: MACRONIX INTERNATIONAL CO., LTD., Hsinchu (TW)

(72) Inventors: Chao-I Wu, Hsinchu (TW); Tien-Yen Wang, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/838,478

(22) Filed: Aug. 28, 2015

(65) Prior Publication Data
US 2016/0372195 A1 Dec. 22, 2016

Related U.S. Application Data

(60) Provisional application No. 62/180,657, filed on Jun. 17, 2015.

(51) Int. Cl.
*G11C 11/00* (2006.01)
*G11C 13/00* (2006.01)

(52) U.S. Cl.
CPC ...... *G11C 13/0069* (2013.01); *G11C 13/0064* (2013.01); *G11C 2013/0066* (2013.01); *G11C 2013/0078* (2013.01)

(58) Field of Classification Search
CPC .................................................. G11C 13/0002
USPC ......................................................... 365/148
See application file for complete search history.

(56) References Cited

U.S. PATENT DOCUMENTS

| 2013/0044534 A1 | 2/2013 | Kawai et al. | |
| 2014/0071734 A1* | 3/2014 | Sugimae | G11C 13/0002 365/148 |
| 2015/0380086 A1* | 12/2015 | Park | G11C 13/0069 365/148 |
| 2016/0148685 A1* | 5/2016 | Roy | G11C 13/0069 365/148 |

OTHER PUBLICATIONS

TIPO Office Action dated Dec. 16, 2016 in Taiwan application (No. 104128268).

* cited by examiner

*Primary Examiner* — Hoai V Ho
(74) *Attorney, Agent, or Firm* — McClure, Qualey & Rodack, LLP

(57) ABSTRACT

An operating method, an operating system and a resistance random access memory (ReRAM) are provided. The operating method includes the following steps. A write voltage and a write current are set at a first predetermined voltage value and a first predetermined current value respectively. The write voltage and the write current are applied to a memory cell of the ReRAM for writing. Whether the write current reaches a second predetermined current value is verified, if a read current of the memory cell is not within a predetermined current range. The write current is increased, if the write current does not reach the second predetermined current value. Whether the write voltage reaches a second predetermined voltage value is verified, if the write current reaches the second predetermined current value. The write voltage is increased, if the write voltage does not reach the second predetermined voltage value.

16 Claims, 4 Drawing Sheets

RESISTANCE RANDOM ACCESS MEMORY WITH ACCURATE FORMING PROCEDURE, OPERATING METHOD THEREOF AND OPERATING SYSTEM THEREOF

This application claims the benefit of U.S. provisional application Ser. No. 62/180,657, filed Jun. 17, 2015, the subject matter of which is incorporated herein by reference.

BACKGROUND

Technical Field

The disclosure relates in general to a memory, an operating method thereof and an operating system thereof, and more particularly to a resistance random access memory (ReRAM), an operating method thereof and an operating system thereof.

Description of the Related Art

Resistance random access memory (ReRAM) has simple structure, good compatibility with CMOS technology and possibility of continue scaling beyond 10 nm generation. ReRAM is attracting a lot of attentions for next generation nonvolatile memories.

Memory cells of the ReRAM can be switched between a set mode and a reset mode by controlling the resistance. If an initial resistance of one of the memory cells is too high, this memory cell may not be accurately switched to be the set mode or the reset mode. Therefore, for accurately switching the memory cell to be the set mode or the reset mode, the memory cells must be performed a forming procedure, such that an initial resistance of the memory cells can be controlled to be lower than a predetermined value before the memory cells are written to be the set mode or the reset mode.

SUMMARY

The disclosure is directed to a resistance random access memory (ReRAM), an operating method thereof and an operating system thereof. By performing an operating method having two loops, a forming procedure can be accurately performed. The resistances of all of the memory cells can be tighten to be within 90 Kohm to 500 Kohm before the memory cells are written to be a set mode or a reset mode.

According to a first aspect of the present disclosure, an operating method of a resistance random access memory (ReRAM) is provided. The operating method includes the following steps. A write voltage is set at a first predetermined voltage value. A write current is set at a first predetermined current value. The write voltage and the write current are applied to a memory cell of the ReRAM for writing. Whether a read current of the memory cell is within a predetermined current range is verified. Whether the write current reaches a second predetermined current value is verified, if the read current is not within the predetermined current range. The write current is increased, if the write current does not reach the second predetermined current value. Whether the write voltage reaches a second predetermined voltage value is verified, if the write current reaches the second predetermined current value. The write voltage is increased, if the write voltage does not reach the second predetermined voltage value.

According to a second aspect of the present disclosure, an operating system of a resistance random access memory (ReRAM) is provided. The operating system includes a voltage controller, a current controller, a write driver and a verifier. The voltage controller is for setting a write voltage at a first predetermined voltage value. The current controller is for setting a write current at a first predetermined current value. The write driver is for applying the write voltage and the write current to a memory cell of the ReRAM. The verifier is for verifying whether a read current is within a predetermined current range. The verifier is further for verifying whether the write current reaches a second predetermined current value, if the read current is not within the predetermined current range. The current controller is further for increasing the write current, if the write current does not reach the second predetermined current value. The verifier is further for verifying whether the write voltage reaches a second predetermined voltage value, if the write current reaches the second predetermined current value. The voltage controller is further for increasing the write voltage, if the write voltage does not reach the second predetermined voltage value.

According to a third aspect of the present disclosure, a resistance random access memory (ReRAM) is provided. The ReRAM includes a plurality of memory cells. A resistance of each of the memory cells is within 90 Kohm to 500 Kohm before each of the memory cells is written to be a set mode or a reset mode.

The above and other aspects of the disclosure will become better understood with regard to the following detailed description of the non-limiting embodiment(s). The following description is made with reference to the accompanying drawings.

BRIEF DESCRIPTION OF THE DRAWINGS

FIG. 1A shows a set operation, a reset operation and a read operation performed on a resistance random access memory (Re-RAM).

DETAILED DESCRIPTION

Some embodiments are disclosed below for elaborating the invention. The following embodiments are for the purpose of elaboration only, not for limiting the scope of protection of the invention. Besides, secondary elements are omitted in the following embodiments to highlight the technical features of the invention.

Figure 1A:
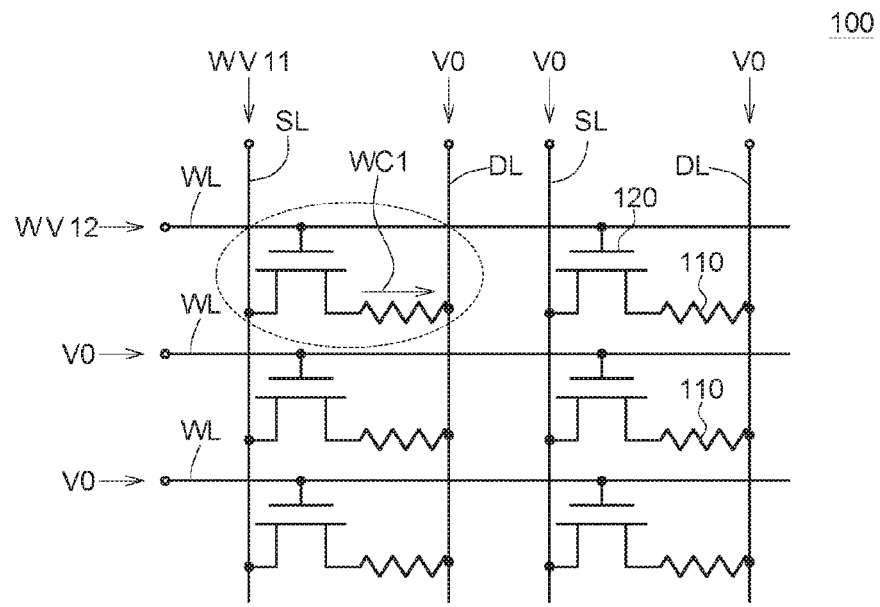
FIGS. 1A, 1B, and 1C respectively show
Figure 1B:
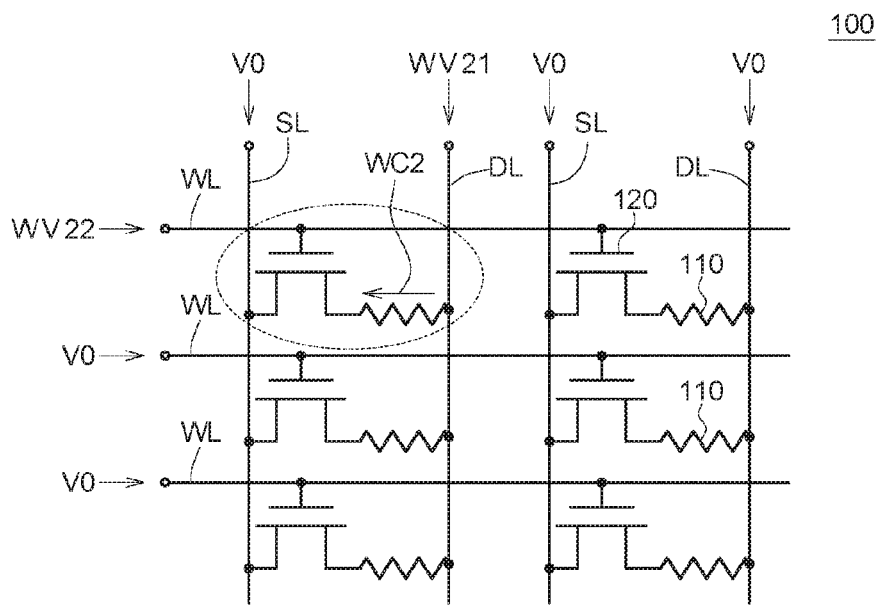
Figure 1C:
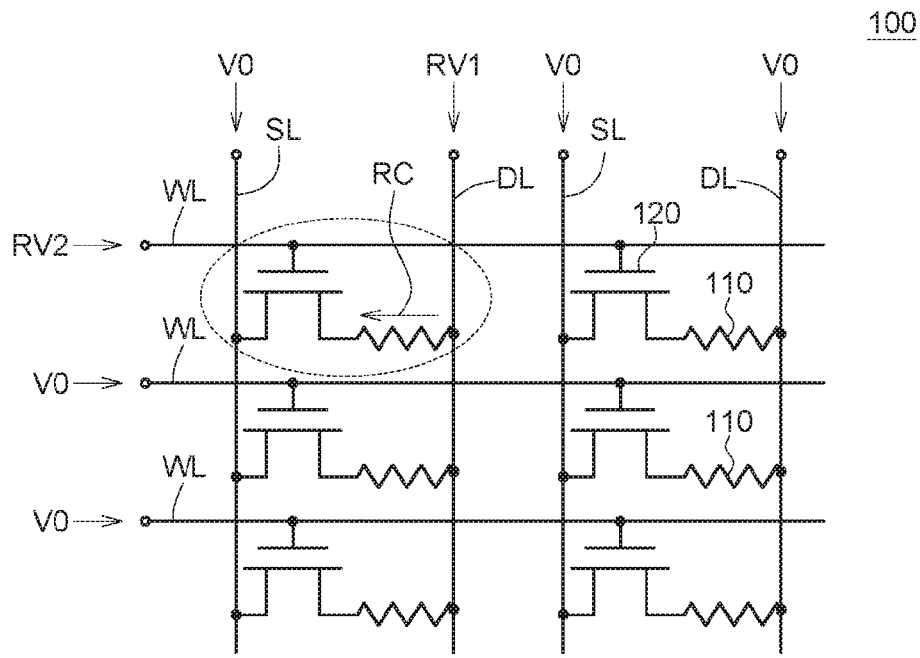

Please refer to FIGS. 1A to 1C. FIG. 1A shows a set operation performed on a resistance random access memory (ReRAM) 100, FIG. 1B shows a reset operation performed on the ReRAM 100, and FIG. 1C shows a read operation performed on the ReRAM 100. The ReRAM 100 includes a plurality of memory cells 110 and a plurality of MOSFETs 120. Each memory cell 110 is connected to a drain of each MOSFET 120. A plurality of world lines WL are electrically connected to gates of the MOSFETs 120. A plurality of source lines SL are electrically connected to sources of the MOSFETs 120. A plurality of drain lines DL are electrically connected to drains of the MOSFETs 120. In another embodiment, each memory cell 110 may be connected to the source of each MOSFET 120.

The memory cells 110 can be switched between a set mode and a reset mode. To switch one of the memory cells 110 to be the set mode, a resistance of this memory cell 110 must be lower than 50 Kohm. To switch one of the memory cells 110 to be the reset mode, the resistance of this memory cell 110 must be higher than 100 Kohm. Due to the resistances, whether the memory cell 110 is at the set mode or at the reset mode can be determined according to a read current.

If the resistance of one of the memory cells 110 is too high, this memory cell 110 may not be accurately switched to be the set mode or the reset mode. Therefore, for accurately switching the memory cells 110 to be the set mode or the reset mode, the memory cells 110 must be performed a forming procedure to control the resistances of the memory cell 110 to be lower than 500 Kohm before the memory cells 110 are written to be the set mode or the reset mode. The writing procedure includes the set operation and the reset operation. Referring to FIG. 1A, the set operation is performed on one selected memory cell 110 (shown as the dotted line). The writing voltage includes a first set voltage WV11 and a second set voltage WV12. The first set voltage WV11 is applied from the source line SL and the second set voltage WV12 is applied from the word line WL. The writing current WC1 passes through the selected memory cell 110. Further, referring to FIG. 1B, the reset operation is performed on one selected memory cell 110 (shown as the dotted line). The writing voltage includes a first reset voltage WV21 and a second reset voltage WV22. The first reset voltage WV21 is applied from the drain line DL and the second reset voltage WV22 is applied from the word line WL. The writing current WC2 passes through the selected memory cell 110. Moreover, referring to FIG. 1C, a read operation is performed on one selected memory cell 110 (shown as the dotted line). A first read voltage RV1 is applied from the drain line DL and a second read voltage RV2 is applied from the word line WL. A read current RC passes through the selected memory cell 110.

Figure 2:
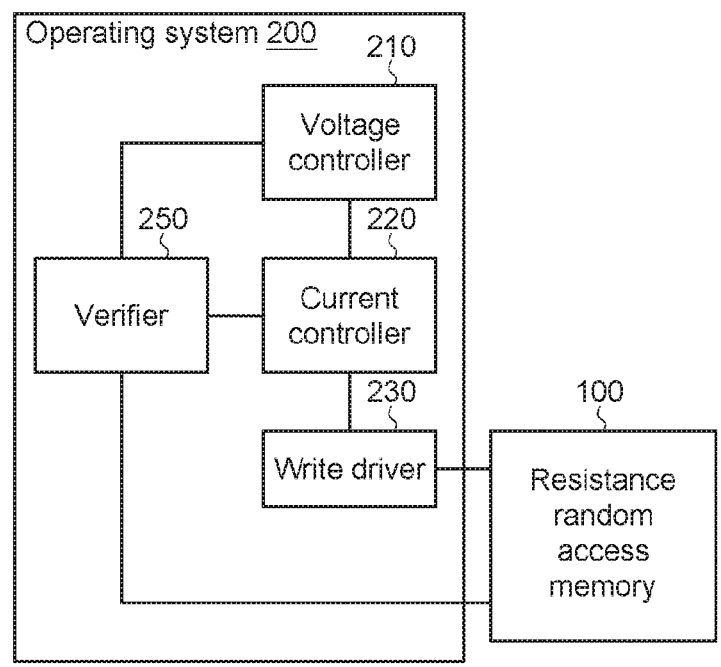
FIG. 2 shows an operating system for the ReRAM.

Please refer to FIG. 2, which shows an operating system 200 for the ReRAN1 100. The operating system 200 includes a voltage controller 210, a current controller 220, a write driver 230, and a verifier 250. The voltage controller 210 is used for controlling write voltages. The current controller 220 is used for controlling write currents. The write driver 230 is used for performing a writing procedure. The verifier 250 is used for performing several verifying procedures.

Any of the voltage controller 210, the current controller 220, the write driver 230 and the verifier 250 may be a computer, a chip, a circuit board, or a storage device storing a plurality of program codes. The operating system 200 can perform the forming procedure to control the resistance of the memory cell 110 to be lower than 500 Kohm.

Figure 3:
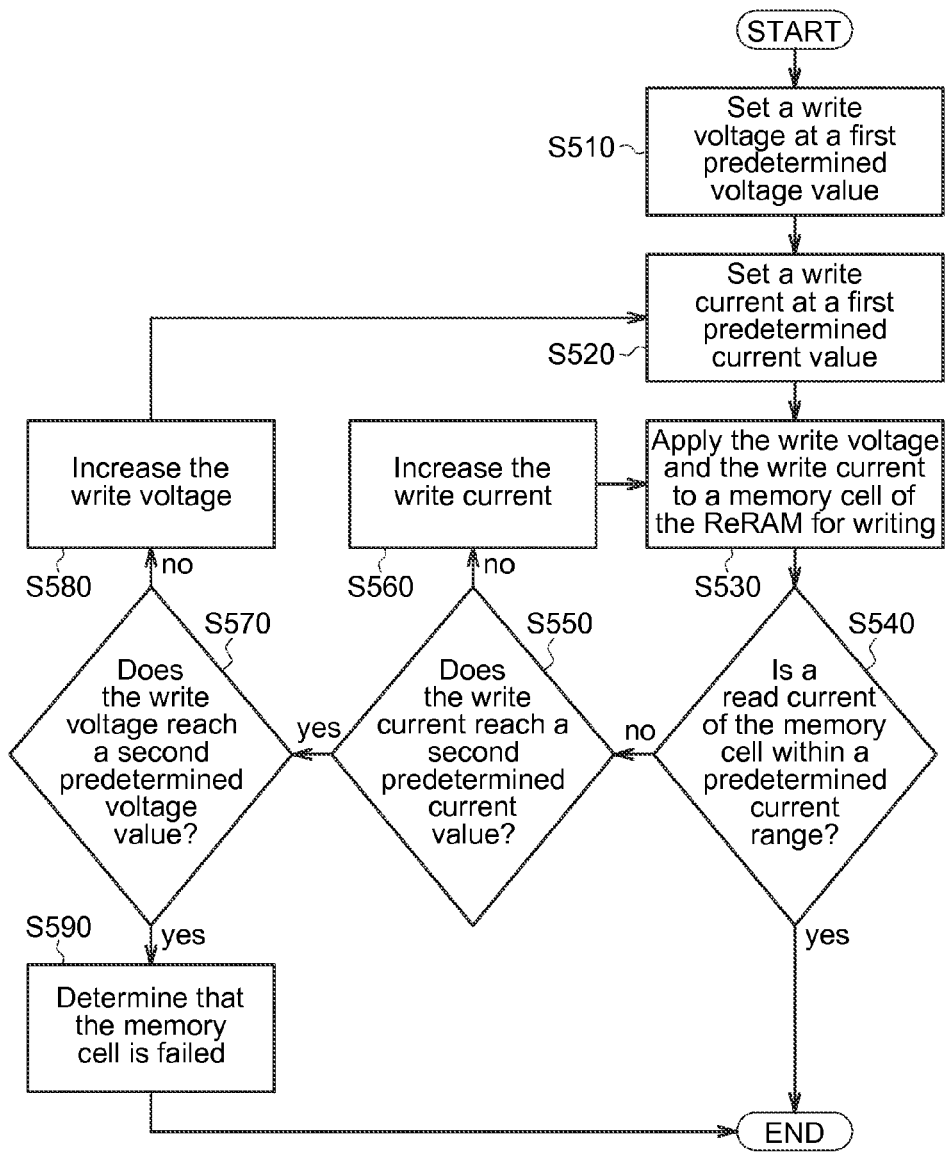
FIG. 3 shows a flow chart of an operating method for the ReRAM.

Please refer to FIG. 3, which shows a flow chart of an operating method for the ReRAM 100. According to the operating method, the forming procedure can be accurately performed and the resistance of each of the memory cells 110 can be controlled to be within a predetermined range.

In step S510, the voltage controller 210 sets a write voltage at a first predetermined voltage value. The first predetermined voltage value is 3.6 V to 5.6 V. For example, the first predetermined voltage value may be 3.6 V, 4 V, 4.6V, 5.2 V or 5.6 V.

In step S520, the current controller 220 sets a write current at a first predetermined current value. The first predetermined current value is 40 uA to 60 uA. For example, the first predetermined current value may be 40 uA, 45 uA, 50 uA, 55 uA or 60 uA.

In step S530, the write driver 230 applies the write voltage and the write current to the memory cell 110 of the ReRAM 100 for writing.

In step S540, the verifier 250 verifies whether the read current of the memory cell 110 is within a predetermined current range. For example, if the memory cell 110 is at the set mode, the resistance of this memory cell 110 must be lower than 50 Kohm and the read current of this memory cell 110 must be higher than a threshold. If the memory cell 110 is at the reset mode, the resistance of this memory cell 110 must be higher than 100 Kohm and the read current of this memory cell 110 must be lower than another threshold. If the read current of the memory cell 110 is within the predetermined current range, then the process is terminated; if the read current of the memory cell 110 is not within the predetermined current range, then the process proceeds to step S550.

In step S550, the verifier 250 verifies whether the write current reaches a second predetermined current value. The second predetermined current value is 100 uA to 300 uA. For example, the second predetermined current value may be 100 uA, 150 uA, 200 uA, 250 uA or 300 uA. If the write current does not reach the second predetermined current value, then the process proceeds to step S560; if the write current reaches the second predetermined current value, then the process proceeds to step S570.

In step S560, the current controller 220 increases the write current. In this step, the write current is increased by a current increment. The current increment is 10 uA to 100 uA. For example, the current increment is 10 uA, 20 uA, 30 uA, 40 uA, 60 uA, 80 uA, or 100 uA. That is to say, by performing the step S520, the step S530, the step S540, the step S550 and the step S560, the write current is increased from the first predetermined current value to the second predetermined current value. And the memory cell 110 is written for several times by applying different write currents. In one example, the write current is increased from 50 uA to 300 uA by increasing 50 uA.

In step S570, the verifier 250 verifies whether the write voltage reaches a second predetermined voltage value. The second predetermined voltage value is 5.2 V to 5.6 V. For example, the second predetermined voltage value may be 5.2 V, 5.4 V or 5.6 V. If the write voltage does not reach the second predetermined voltage value, then the process proceeds to step S580; if the write voltage reaches the second predetermined current value, then the process proceeds to step S590.

In step S580, the voltage controller 210 increases the write voltage. In this step, the write voltage is increased by a voltage increment. The voltage increment is 0.1 V to 0.5 V. For example, the voltage increment is 0.1 V, 0.2 V, 0.3 V, 0.4 V or 0.5 V. That is to say, by performing the step S510, the step S530, the step S540, the step S570 and the step S580, the write voltage is increased from the first predetermined voltage value to the second predetermined voltage value. And the memory cell 110 is written for several times by applying different write voltages. In one example, the write voltage is increased from 4.6 V to 5.4 V by increasing 0.2 V.

In step S590, the memory cell 110 is determined as being failed. In some case, one memory cell 110 whose resistance cannot be accurately controlled must be determined as being failed.

According the operating method above, the forming procedure includes two loops. One loop is used for increasing the write current, and another loop is used for increasing the write voltage.

Figure 4:
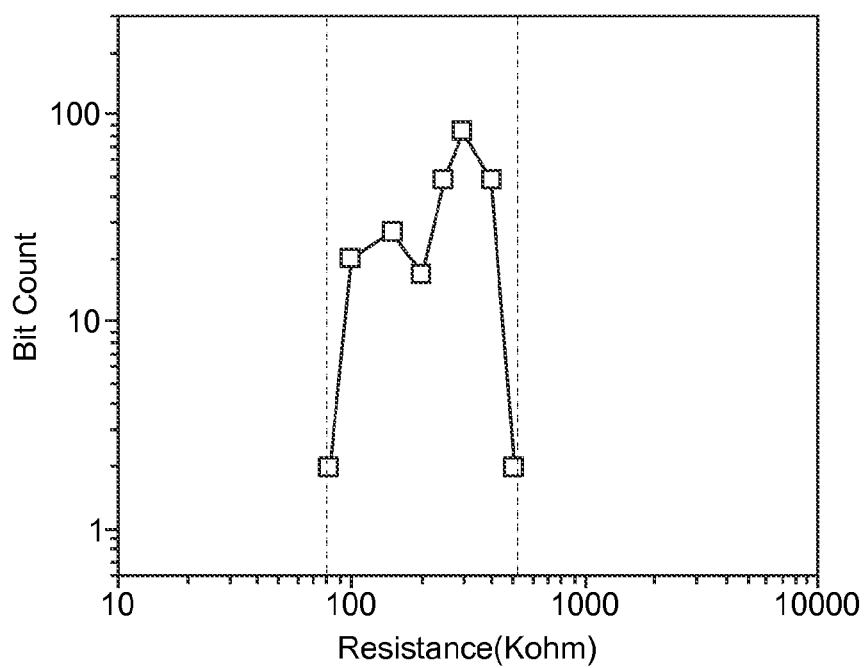
FIG. 4 shows a resistance distribution of the memory cells before the memory cells are written to be a set mode or a reset mode.

Please refer to FIG. 4, which shows a resistance distribution of the memory cells 110 before the memory cells 110 are written to be the set mode or the reset mode. According to the operating method above, the forming procedure can be accurately performed and the resistances of all of the memory cells 110 can be tighten to be within 90 Kohm to 500 Kohm.

In another embodiment, the memory cells 110 may be written only one time during the forming procedure. Or, in other embodiment, the memory cells 110 may be written several times by applying different write currents and a fixed write voltage during the forming procedure. In those embodiments, the resistances of some of the memory cells 110 cannot be tighten to be within 90 Kohm to 500 Kohm. Actually, if the write current is too large, over-forming may be happened and the resistances of some of the memory cells 110 will be lower than 90 Kohm. If the write current is too small, weak-forming may be happened and the resistances of some of the memory cells 110 will be larger than 500 Kohm.

Figure 5:
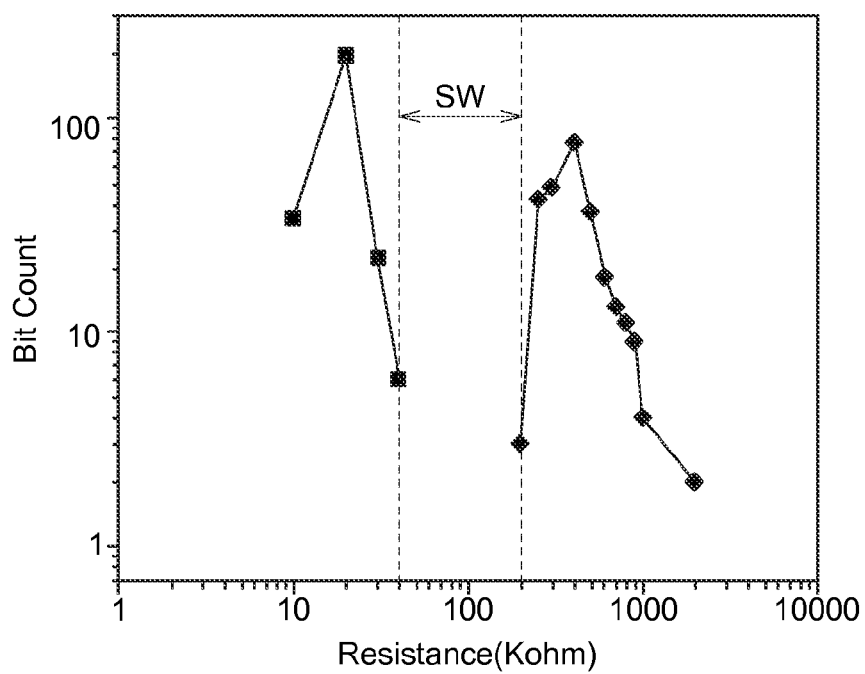
FIG. 5 shows a resistance distribution of the memory cells which have been performed a forming procedure of FIG. 3 after some of the memory cells are written to be the set mode and some of the memory cells are written to be the reset mode.

Please refer to FIG. 5, which shows a resistance distribution of the memory cells 110 which have been performed the forming procedure of FIG. 3 after some of the memory cells 110 are written to be the set mode and some of the memory cells 110 are written to be reset mode. Because all of the memory cells 110 are tighten to be within 90 Kohm to 500 Kohm, the resistances of some of the memory cells 110 which are written to be the set mode can be controlled to be lower than 50 Kohm, and the resistances of some of the memory cells which are written to be the reset mode can be controlled to be higher than 100 Kohm. There is a switch window SW shown on the resistance distribution of FIG. 5. Due to the switch window SW, whether the memory cell 110 is written to be the set mode or the reset mode can be correctly identified.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An operating method of a resistance random access memory (ReRAM), comprising:
   setting a write voltage in a voltage controller at a first predetermined voltage value;
   setting a write current in a current controller at a first predetermined current value;
   applying the write voltage and the write current by the write driver connected to the voltage controller and the current controller to a memory cell of the ReRAM for writing through a word line and a bit line respectively;
   verifying whether a read current of the memory cell in the bit line is within a predetermined current range through a verifier connected to the bit line;
   verifying whether the write current reaches a second predetermined current value, if the read current is not within the predetermined current range;
   increasing the write current, if the write current does not reach the second predetermined current value;
   verifying whether the write voltage reaches a second predetermined voltage value, if the write current reaches the second predetermined current value; and
   increasing the write voltage, if the write voltage does not reach the second predetermined voltage value.

2. The operating method according to claim 1, wherein the first predetermined current value is 40 uA to 60 uA.

3. The operating method according to claim 1, wherein the second predetermined current value is 100 uA to 300 uA.

4. The operating method according to claim 1, wherein in the step of increasing the write current, the write current is increased by a current increment, and the current increment is 10 uA to 100 uA.

5. The operating method according to claim 1, wherein the first predetermined voltage value is 3.6 V to 5.6 V.

6. The operating method according to claim 1, wherein the second predetermined voltage value is 5.2 V to 5.6 V.

7. The operating method according to claim 1, wherein in the step of increasing the write voltage, the write voltage is increased by a voltage increment, and the voltage increment is 0.1 V to 0.5 V.

8. The operating method according to claim 1, wherein after the step of increasing the write voltage, the step of setting the write current at the first predetermined current value is performed.

9. An operating system of a resistance random access memory (ReRAM), comprising:
   a voltage controller for setting a write voltage at a first predetermined voltage value;
   a current controller for setting a write current at a first predetermined current value;
   a write driver connected to the voltage controller and the current controller to apply the write voltage and the write current to a memory cell of the ReRAM through a word line and a bit line respectively;
   and
   a verifier connected to the bit line to apply whether a read current in the bit line is within a predetermined current range;
   wherein the verifier is further connected to the current controller to verify whether the write current reaches a second predetermined current value, if the read current is not within the predetermined current range;
   the current controller is further for increasing the write current, if the write current does not reach the second predetermined current value;
   the verifier is further connected to the voltage controller to verify whether the write voltage reaches a second predetermined voltage value, if the write current reaches the second predetermined current value;
   the voltage controller is further for increasing the write voltage, if the write voltage does not reach the second predetermined voltage value.

10. The operating system according to claim 9, wherein the first predetermined current value is 40 uA to 60 uA.

11. The operating system according to claim 9, wherein the second predetermined current value is 100 uA to 300 uA.

12. The operating system according to claim 9, wherein the write current is increased by a current increment, and the current increment is 10 uA to 100 uA.

13. The operating system according to claim 9, wherein the first predetermined voltage value is 3.6 V to 5.6 V.

14. The operating system according to claim 9, wherein the second predetermined voltage value is 5.2 V to 5.6 V.

15. The operating system according to claim 9, wherein the write voltage is increased by a voltage increment, and the voltage increment is 0.1 V to 0.5 V.

16. The operating system according to claim 9, wherein after increasing the write voltage, the current controller sets the write current at the first predetermined current value.

* * * * *